United States Patent
Kurimoto et al.

(10) Patent No.: US 10,340,881 B2
(45) Date of Patent: Jul. 2, 2019

(54) BONDED SUBSTRATE, SURFACE ACOUSTIC WAVE ELEMENT, SURFACE ACOUSTIC WAVE DEVICE, AND METHOD OF MANUFACTURING BONDED SUBSTRATE

(71) Applicants: Kouhei Kurimoto, Muroran-shi, Hokkaido (JP); Kazuhito Kishida, Shinagawa-ku, Tokyo (JP); Rinzo Kayano, Muroran-shi, Hokkaido (JP); WASEDA UNIVERSITY, Shinjuku-ku, Tokyo (JP); Shoji Kakio, Kofu-shi, Yamanashi (JP)

(72) Inventors: Kouhei Kurimoto, Hokkaido (JP); Kazuhito Kishida, Tokyo (JP); Rinzo Kayano, Hokkaido (JP); Jun Mizuno, Tokyo (JP); Shoji Kakio, Yamanashi (JP)

(73) Assignees: THE JAPAN STEEL WORKS, LTD., Tokyo (JP); WASEDA UNIVERSITY, Tokyo (JP); UNIVERSITY OF YAMANASHI, Yamanashi (JP)

( * ) Notice: Subject to any disclaimer, the term of this patent is extended or adjusted under 35 U.S.C. 154(b) by 280 days.

(21) Appl. No.: 15/423,979

(22) Filed: Feb. 3, 2017

(65) Prior Publication Data
US 2018/0048282 A1 Feb. 15, 2018

(30) Foreign Application Priority Data
Aug. 10, 2016 (JP) .................................. 2016-157122

(51) Int. Cl.
*H03H 9/25* (2006.01)
*H03H 9/02* (2006.01)
(Continued)

(52) U.S. Cl.
CPC .......... *H03H 9/02551* (2013.01); *H03H 3/08* (2013.01); *H03H 9/02559* (2013.01); *H03H 9/25* (2013.01); *H03H 9/64* (2013.01)

(58) Field of Classification Search
USPC .................... 310/313 R, 313 A–313 D, 361; 333/193–197
See application file for complete search history.

(56) References Cited

U.S. PATENT DOCUMENTS 7,609,129 B2 10/2009 Yokota et al.
2008/0229831 A1* 9/2008 Serban ................ B81C 1/00206
73/589

FOREIGN PATENT DOCUMENTS

JP 2001053579 A 2/2001
JP 2006042008 A 2/2006
(Continued)

OTHER PUBLICATIONS

Atsushi Isobe, et al., "Longitudinal Leaky SAW-Resonator in LiNbO3—the Combined Finite-Element and Analytical Method", Conference of Engineering Sciences Society in the Institute of Electronics, Information and Communication Engineers, A-195, 1996, p. 196.

(Continued)

*Primary Examiner* — Thomas M Dougherty
(74) *Attorney, Agent, or Firm* — Holtz, Holtz & Volek PC

(57) ABSTRACT

There is provided a bonded substrate including: a quartz substrate; and a piezoelectric substrate which is bonded on the quartz substrate and on which a surface acoustic wave propagates, wherein the quartz substrate and the piezoelectric substrate are bonded at a bonding interface through covalent bonding, and a surface acoustic wave element having a higher phase velocity and a higher electromechani-
(Continued)

cal coupling factor than conventional one is obtained by disposing an interdigital electrode on a principal surface of the piezoelectric substrate.

11 Claims, 7 Drawing Sheets

(51) Int. Cl.
*H03H 3/08* (2006.01)
*H03H 9/64* (2006.01)

(56) References Cited

FOREIGN PATENT DOCUMENTS

| | | |
|---|---|---|
| JP | 2011087079 A | 4/2011 |
| JP | 2013030829 A | 2/2013 |

OTHER PUBLICATIONS

Yasumi Kobayashi, et al., "GHz-Band Surface Acoustic Wave Devices Using the Second Leaky Mode on LiTaO3 and LiNbO3", Jpn. J. Appl. Phys. vol. 36 (Sep. 1997), Part 1, No. 9B, pp. 6083-6087.

* cited by examiner

BONDED SUBSTRATE, SURFACE ACOUSTIC WAVE ELEMENT, SURFACE ACOUSTIC WAVE DEVICE, AND METHOD OF MANUFACTURING BONDED SUBSTRATE

The present U.S. patent application claims a priority under the Paris Convention of Japanese patent application No. 2016-157122 filed on Aug. 10, 2016, the entirety of which is incorporated herein by references.

BACKGROUND OF THE INVENTION

Field of the Invention

The present invention relates to a bonded substrate using a surface acoustic wave, a surface acoustic wave element, a surface acoustic wave device, and a method of manufacturing the bonded substrate.

Description of the Related Art

With progress of mobile communication devices such as a mobile phone, high-performance surface acoustic wave (surface acoustic wave: SAW) devices are being also requested. In particular, for high-frequency and broadband operation, SAW substrates are being requested to have a high-speed and high-coupling SAW mode, and excellent temperature characteristics for preventing a passband from moving due to temperature change.

Furthermore, a longitudinal-type leaky surface acoustic wave (also called LLSAW or the like) has a phase velocity close to 1.5 times to 2.0 times as that of a Rayleigh wave, and is one of propagation modes advantageous to high-frequency SAW devices. Unfortunately, it has exceedingly large propagation attenuation since it propagates along with leakage of bulk waves of an SH wave and an SV wave.

Japanese Patent Laid-Open No. 2013-30829 (hereinafter referred to as Patent Literature 1) proposes a technology in which a proton exchange layer is formed in the vicinity of the surface of a lithium niobate substrate, after that, a reverse proton exchange layer is formed only at the surface layer, and thereby, losses caused by bulk wave radiation of an LLSAW are to be reduced.

Also in "GHz-band surface acoustic wave devices using the second leaky mode", Appl. Phis., vol. 36, no9B, pp. 6083-6087, 1997, and in "Longitudinal Leaky SAW-Resonator in LiNbO_3: the Combined Finite-Element and Analytical Method", Conference of Engineering Sciences Society in the Institute of Electronics, Information and Communication Engineers, A-195, p. 196, 1996, optimizations of a substrate orientation and an electrode film thickness are attempted as techniques for low loss LLSAWs.

Moreover, as to temperature characteristics, temperature coefficients of change in frequency are, for example, −35 ppm/° C. for lithium tantalate which is currently often used and −79 ppm/° C. for lithium niobate, and variation in frequency is large. Therefore, the temperature coefficient of change in frequency is needed to be reduced.

Meanwhile, although the temperature coefficient of ST-cut quartz is 0 ppm/° C., which is an excellent property, it is largely inferior in propagation velocity and coupling factor to lithium tantalate and lithium niobate.

Japanese Patent Laid-Open No. 2001-53579 (hereinafter referred to as Patent Literature 2) discloses a device obtained by bonding a SAW propagating substrate and a supporting substrate with an organic thin film layer. The propagating substrate is a lithium tantalate substrate, for example, with 30 μm of thickness, which is pasted on a glass substrate with 300 μm of thickness with an organic adhesive agent with 15 μm of thickness.

Japanese Patent Laid-Open No. 2006-42008 (hereinafter referred to as Patent Literature 3) also discloses a SAW device obtained by pasting a lithium tantalate substrate (thickness: 125 μm) on a quartz glass substrate (thickness: 125 μm) with an adhesive agent.

Japanese Patent Laid-Open No. 2011-87079 (hereinafter referred to as Patent Literature 4) reports that the temperature characteristics are improved by using a thinner organic adhesive layer in bonding between a lithium tantalate substrate and a supporting substrate.

SUMMARY OF THE INVENTION

However, while in Patent Literature 1, it is confirmed that losses caused by bulk wave radiation of an LLSAW are reduced and propagation characteristics and the like are remarkably improved, there is problem that in the yield of devices having the proposed structure is extremely poor.

Neither Patent Literature 2 nor Patent Literature 3 discloses specific data that the temperature characteristics are improved.

While in Patent Literature 4, the temperature characteristics are improved by using a thin organic adhesive layer, 15 ppm/° C. still does not reach 0 ppm/° C. of ST-cut quartz, and moreover, there are problems, for example, that the yield is poor due to bonding with the adhesive agent.

Problems to be solved by the present invention are to achieve high frequency and broadband operation by using an LLSAW or the like without its propagation attenuation, to reduce the temperature coefficient of the frequency, and to improve the yield of bonded substrates.

The present invention is devised in view of the aforementioned circumstances and an object thereof is to provide a bonded substrate, a surface acoustic wave element, a surface acoustic wave device, and a method of manufacturing the bonded substrate which enable the aforementioned problems to be solved.

To achieve at least one of the abovementioned objects, there is provided a bonded substrate according to a first aspect of the present invention, including: A bonded substrate comprising: a quartz substrate; and a piezoelectric substrate which is bonded on or above the quartz substrate and on which a surface acoustic wave propagates, wherein the quartz substrate and the piezoelectric substrate are covalently bonded at an interface.

In the above-mentioned bonded substrate, It is preferred that the piezoelectric substrate is for exciting a longitudinal-type leaky surface acoustic wave.

In the above-mentioned bonded substrate, It is preferred that the bonded substrate further comprises an amorphous layer between the quartz substrate and the piezoelectric substrate, wherein the amorphous layer is covalently bonded to both of the quartz substrate and the piezoelectric substrate.

In the above-mentioned bonded substrate, It is preferred that the amorphous layer has 100 nm or less of thickness.

In the above-mentioned bonded substrate, It is preferred that the amorphous layer comprises silicon dioxide or aluminum oxide.

In the above-mentioned bonded substrate, It is preferred that a thickness of the piezoelectric substrate corresponds to 0.05 to 10 wavelengths with respect to a wavelength of the surface acoustic wave.

In the above-mentioned bonded substrate, It is preferred that the quartz substrate has 150 to 500 μm of thickness.

In the above-mentioned bonded substrate, It is preferred that the piezoelectric substrate is composed of lithium tantalate or lithium niobate.

In the above-mentioned bonded substrate, It is preferred that the piezoelectric substrate is 36° to 45° Y-cut lithium tantalate, X-cut lithium tantalate, 128° Y-cut lithium niobate, or X-cut lithium niobate.

To achieve at least one of the abovementioned objects, there is provided a surface acoustic wave element of the present invention, including at least one interdigital electrode on a principal surface of the piezoelectric substrate in the bonded substrate of the present invention.

To achieve at least one of the abovementioned objects, there is provided a surface acoustic wave device of the present invention, wherein the surface acoustic wave element of the aforementioned aspect is sealed in a package.

To achieve at least one of the abovementioned objects, there is provided a method of manufacturing a bonded substrate according to a first aspect of the present invention, the bonded substrate having a quartz substrate and a piezoelectric substrate bonded, the method including: irradiating a bonding surface of the quartz substrate and a bonding surface of the piezoelectric substrate with ultraviolet light under a pressure lower than atmosphere pressure; after the irradiation, bringing the bonding surface of the quartz substrate and the bonding surface of the piezoelectric substrate into contact with each other; and pressurizing the quartz substrate and the piezoelectric substrate in a thickness direction to bond the bonding surfaces.

In the above-mentioned method of manufacturing a bonded substrate, It is preferred that heating at a predetermined temperature is performed in the pressurization.

In the above-mentioned method of manufacturing a bonded substrate, It is preferred that the quartz substrate is obtained by growing a crystal by a hydrothermal synthesis method and cutting it out in an arbitrary direction.

In the above-mentioned method of manufacturing a bonded substrate, It is preferred that an amorphous layer is interposed on one or both of the bonding surfaces of the quartz substrate and the piezoelectric substrate.

In the above-mentioned method of manufacturing a bonded substrate, It is preferred that the amorphous layer is attached by a thin film forming method.

Hereafter, the reasons for defining the technical matters the way in the present invention are described.

Covalent Bonding

The quartz substrate and the piezoelectric substrate undergo covalent bonding directly or via an amorphous layer, and thereby, bonding strength can be secured. For example, when $SiO_2$ is used with interposition of the amorphous layer, the covalent bonding is Si—O—Si and this portion is a bonding layer.

It should be noted that no interposition of the amorphous layer is necessarily needed in the present invention.

Amorphous Layer

The amorphous layer can be interposed at the bonding interface between the quartz substrate and the piezoelectric substrate to secure the covalent bonding more.

Notably, the material of the amorphous layer is not specially limited in the present invention but $SiO_2$ or $Al_2O_3$ can be preferably used. In particular, since the amorphous layer of $SiO_2$ tends to generate particles in deposition, which causes defects of bonding, $Al_2O_3$ which has low generation rate of particles is more desirable.

The aforementioned amorphous layer is desirable to have a thickness of 100 nm or less since internal stress occurs in the thin film, which results in bending of the substrate itself and cannot secure the bonding place to be flat. For the same reason, it is further desirable to be 5 nm or less.

Thickness of the Quartz Substrate: 150 to 500 μm

The thickness of the quartz substrate is desirable to be within the aforementioned range in order to utilize a feature of the quartz substrate that a temperature property thereof is close to 0. For the same reason, it is further desirable that the lower limit is 200 μm and the upper limit is 500 μm.

Thickness of the piezoelectric substrate: 0.05 to 10 wavelengths with respect to the wavelength of the surface acoustic wave The thickness of the piezoelectric substrate is desirable to be 0.05 wavelengths to 10 wavelengths with respect to the wavelength of the surface acoustic wave in order to produce the LLSAW (longitudinal-type leaky surface acoustic wave). The LLSAW is a propagation mode having a propagation velocity 1.5 to 2 times higher than that of an LSAW (leaky surface acoustic wave). To enhance the propagation velocity, the abovementioned thickness of the piezoelectric substrate is effective. In the case of bonding to quartz, it slows down as being thicker.

A specific thickness is exemplarily 0.1 to 100 μm. For the same reason, it is further desirable that the lower limit is 0.1 μm and the upper limit of 10 μm.

Piezoelectric Substrate: Lithium Tantalate or Lithium Niobate

As the material of the substrate, lithium tantalate or lithium niobate is currently most often used for SAW devices, their quality is excellent, and their substrate costs are reasonable.

It should be noted that the material of the piezoelectric substrate is not limited to the above in the present invention.

Piezoelectric Substrate:

Lithium tantalate in which the plane orientation is 36° to 45° Y-cutting or lithium niobate in which the plane orientation is 128° Y-cutting;

or

Lithium tantalate in which the plane orientation are X-cutting or lithium niobate in which the plane orientation are X-cutting.

These are the substrate cutting orientations in which LSAWs easily occur on the substrate surface, and meanwhile, bulk waves and leaky waves occur inside the substrate. Namely, these are the substrate cutting orientations in which the waves easily occur, and it is desirable to select the aforementioned substrate orientations.

Notably, the propagating orientation is desirable to be X-propagating for Y-cutting and Y-propagating for X-cutting.

Irradiation with Ultraviolet Light Under a Pressure Lower than Atmosphere Pressure Irradiation with ultraviolet light activates the bonding surface to generate OH groups. The wavelength of the ultraviolet light is not specially limited but, for example, 10 to 200 nm can be presented.

Notably, the evacuation of the atmosphere can prevent the ultraviolet light from being absorbed by the atmosphere. The lower the pressure of the evacuation is, the more the effect of preventing the absorption is. For example, it is desirable to be 10 Pa or less. It should be noted that in too much a pressure lower than atmosphere pressure the effect saturates, which increases equipment costs.

Heating at Predetermined Temperature

While the quartz substrate and the piezoelectric substrate are in contact with each other at the bonding surfaces, heating can be performed to effectively facilitate the covalent bonding. The heating temperature is desirable to be approximately 150 to 200° C. Here, the heating temperature is desirable to be 200° C. or less for the reason that the substrate is prevented from breaking in recovery to ambient temperature due to the difference in thermal expansion coefficient between the quartz substrate and the piezoelectric substrate. Moreover, since in covalent bonding, $H_2O$ is generated as a by-product, it is desirable to be 150° C. or more in order to remove $H_2O$ completely.

Pressure in Pressurization

When bonding the quartz substrate and the piezoelectric substrate, it is desirable to apply pressure between both of them. The bonding is promoted in the case of 0.5 Pa or more. On the other hand, because of a possibility of breakage of the substrate in the case of too much pressure, it is desirable that the upper limit is 10 MPa or less.

According to the bonded substrate of the present invention, the quartz substrate and the piezoelectric substrate are bonded in excellent yield. The surface acoustic wave element using this bonded substrate affords a high phase velocity and a high electromechanical coupling factor. Accordingly, a SAW substrate can be produced in which an LLSAW does not suffer from propagation attenuation and the temperature coefficient of the frequency is reduced to a pressure lower than atmosphere pressure. As a result, a SAW substrate can be obtained which has a high-speed and high-coupling SAW mode, and excellent temperature characteristics for preventing a passband from moving due to temperature change for high-frequency and broadband operation requested for next-generation mobile communication devices.

BRIEF DESCRIPTION OF THE DRAWINGS

The above and other objects, advantages and features of the present invention will become more fully understood from the detailed description given hereinbelow and the appended drawings which are given by way of illustration only, and thus are not intended as a definition of the limits of the present invention, and wherein.

DETAILED DESCRIPTION OF THE PREFERRED EMBODIMENTS

Hereafter, a bonded substrate and a surface acoustic wave element of an embodiment of the present invention are described.

Figure 1:
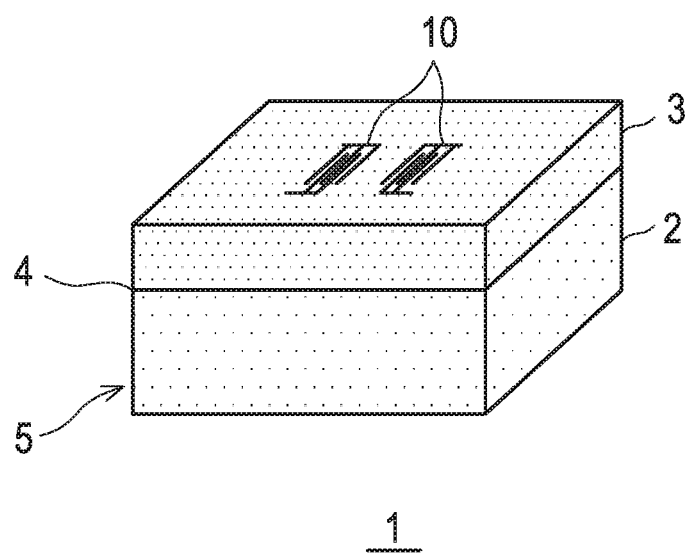
FIG. 1 is a schematic diagram illustrating a bonded substrate and a surface acoustic wave element in an embodiment of the present invention.

As shown in FIG. 1, a bonded substrate 5 has a quartz substrate 2 and a piezoelectric substrate 3 bonded via a bonding interface 4. The quartz substrate 2 and the piezoelectric substrate 3 are bonded at the bonding interface 4 through covalent bonding.

The quartz substrate 2 preferably has 150 to 500 μm of thickness. The piezoelectric substrate 3 preferably has a thickness corresponding to 0.05 to 10 wavelengths with respect to the wavelengths of a surface acoustic wave.

The quartz substrate 2 can be used, for example, which is obtained by growing a crystal by a hydrothermal synthesis method and cutting it out in an arbitrary direction. The piezoelectric substrate 3 can employ a proper material and be composed, for example, of lithium tantalate or lithium niobate. In particular, it can employ lithium tantalate that is Y-cut at 36° in plane orientation and X-propagating or lithium niobate that is Y-cut at 128° and X-propagating.

Figure 2:
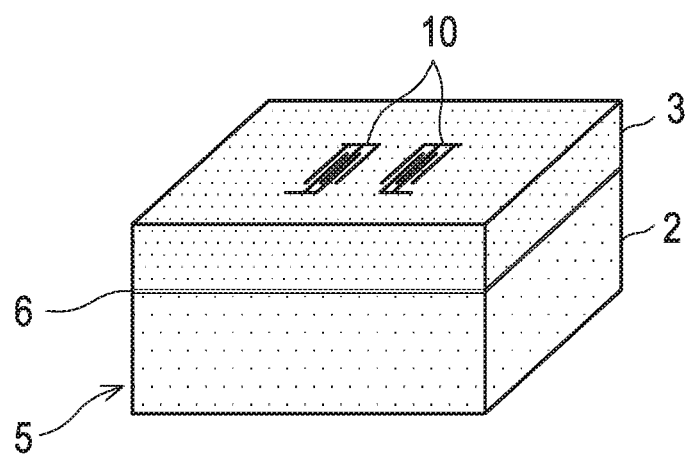
FIG. 2 is a schematic diagram illustrating a bonded substrate and a surface acoustic wave element in another embodiment.

Moreover, as shown in FIG. 2, an amorphous layer 6 can be interposed between the quartz substrate 2 and the piezoelectric substrate 3 to afford a surface acoustic wave element 1A. Notably, the same configurations as those in the aforementioned embodiment are given the same signs and their description is omitted.

In this embodiment, when the amorphous layer 6 is interposed, a bonding interface exists between the amorphous layer 6 and the quartz substrate 2, and on the other side of the amorphous layer 6, a bonding interface exists between the amorphous layer 6 and the piezoelectric substrate 3. The material of the amorphous layer 6 is not specially limited in the present invention but $SiO_2$, $Al_2O_3$ or the like can be used. Moreover, the thickness of the amorphous layer is desirably 100 nm or less.

Notably, in forming the amorphous layer 6, the amorphous layer 6 is formed by forming a thin film on the surface of the quartz substrate 2 or the piezoelectric substrate 3. Moreover, amorphous layers can be formed on both the surface of the quartz substrate 2 and the surface of the piezoelectric substrate 3.

The amorphous layer can be formed by a known method, and chemical vapor deposition or physical vapor deposition such as sputtering can be used.

Figure 3:
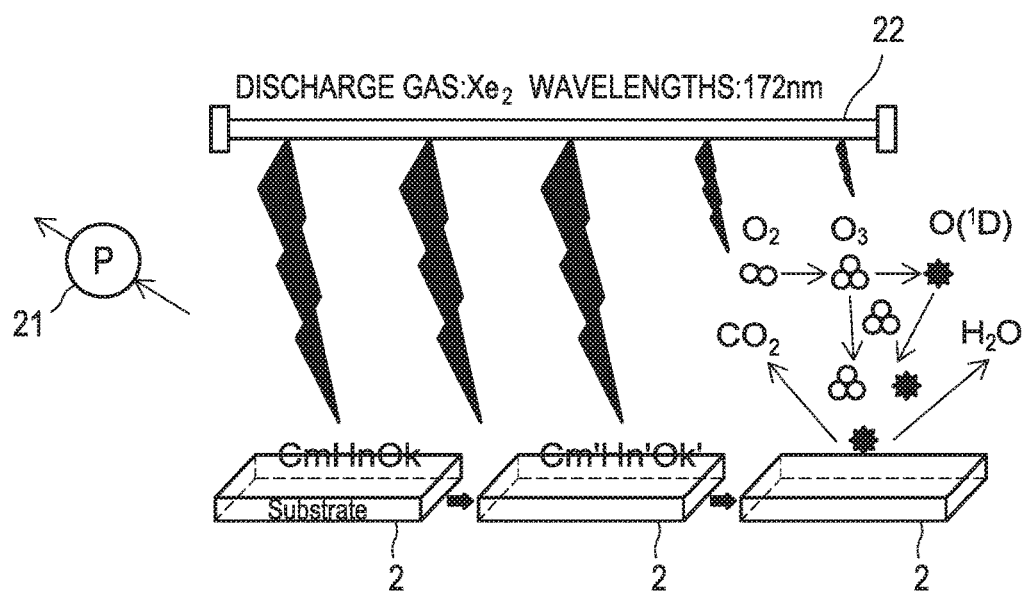
FIG. 3 is a schematic diagram illustrating a bonding processing apparatus used for manufacturing the bonded substrate in an embodiment of the present invention.

Next, manufacturing of the bonded substrate and the surface acoustic wave element is described with reference to FIG. 3.

A quartz substrate and a piezoelectric substrate of predetermined materials are prepared. Notably, when an amorphous layer is formed on the bonding surface, with respect to one or both of the quartz substrate and the piezoelectric substrate targeted for the formation, deposition processing is performed on the bonding surface side. A method of the deposition processing is not specially limited but a thin film forming technique such as a vacuum vapor deposition method or a sputtering method can be used. For example, an amorphous layer which has 100 nm or the less of the thickness can be formed on the bonding surface by electron cyclotron resonance plasma deposition. This amorphous film can be formed to have exceedingly high film density, and hence, the degree of activation of the bonding surface is high, which results in generation of more OH groups.

The prepared quartz substrate 2 and piezoelectric substrate 3 are set in a processing apparatus 20 with a tightly-sealed structure. The figure presents only the quartz substrate 2.

A vacuum pump 21 is connected to the processing apparatus 20, and the processing apparatus 20 is evacuated, for example, at a pressure not more than 10 Pa. Discharge gas is introduced into the processing apparatus 20 and discharge is performed by a discharge apparatus 22 in the processing apparatus 20 to generate ultraviolet light. The discharge can be performed by using a method of applying high frequency voltage or the similar method.

The quartz substrate 2 and the piezoelectric substrate 3 are set in the state where they can be irradiated with ultraviolet light, and the bonding surfaces of these are irradiated with ultraviolet light to be activated. Notably, in the case where an amorphous layer is formed on one or both of the quartz substrate 2 and the piezoelectric substrate 3, the irradiation with ultraviolet light is performed with the surface of the amorphous layer being as the bonding surface.

On the quartz substrate 2 and the piezoelectric substrate 3 that have undergone the irradiation with ultraviolet light, the bonding surfaces of them are brought into contact with each other and heated at ambient temperature or a temperature not more than 200° C., and pressure is applied across both of them to perform bonding. The applied pressure can be set at 10 Pa and the processing time can be set to be approximately from 5 minutes to 4 hours. It should be noted that neither the pressure value nor the processing time is specially limited in the present invention.

By the aforementioned processing, the quartz substrate 2 and the piezoelectric substrate 3 are securely bonded at the bonding interface through covalent bonding.

Figure 4:
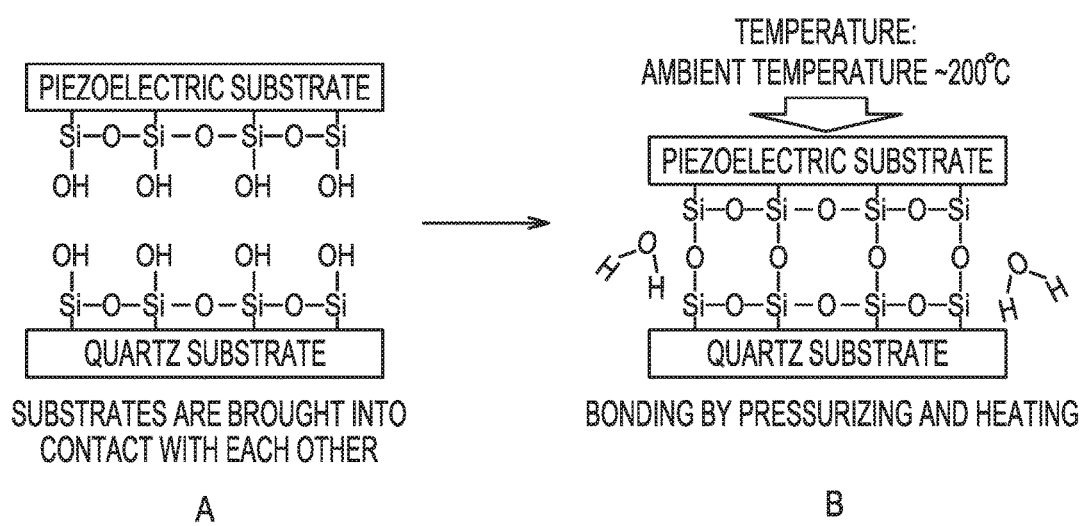
FIG. 4 is a diagram for explaining a bonding mode of the quartz substrate and the piezoelectric substrate in the same embodiment.

FIG. 4 shows states of the bonding surfaces of the quartz substrate 2 and the piezoelectric substrate 3.

Portion A of the figure shows a state where the bonding surfaces are activated by irradiation with ultraviolet light and OH groups are formed on the surfaces. Portion B of the figure shows a state where the substrates are brought into contact with each other, and pressurized and heated to perform bonding. In the bonding, the OH groups react with one another to make covalent bonding between the substrates. Extra $H_2O$ is removed outside in heating.

The aforementioned steps afford the bonded substrate. With respect to the bonded substrate, as shown in FIG. 1, patterns of interdigital electrodes 10 are formed on the principal surface of the piezoelectric substrate 3. A method of forming the interdigital electrodes 10 is not specially limited but a proper method can be used. Moreover, for the shape of the interdigital electrode 10, a proper shape can be employed. The aforementioned steps afford the surface acoustic wave element 1.

Figure 5:
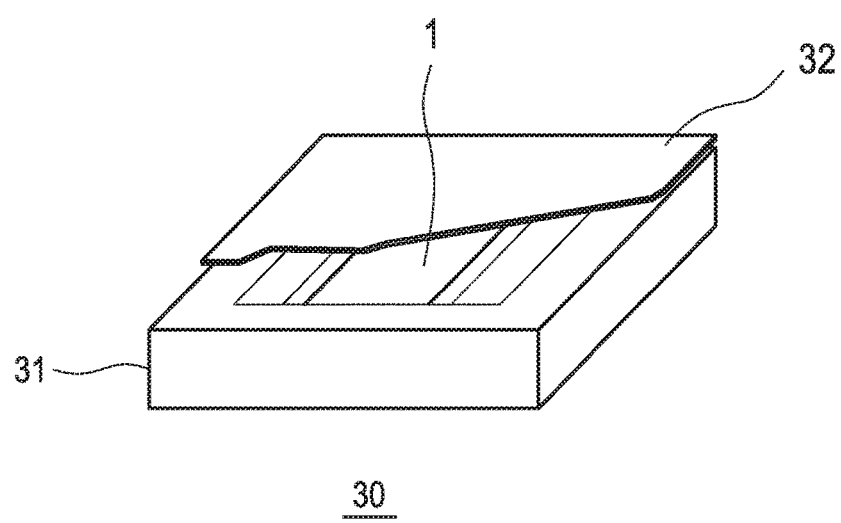
FIG. 5 is a schematic diagram illustrating a surface acoustic wave device in the same embodiment.

As shown in FIG. 5, the surface acoustic wave element 1 can be set in a packaging 31, connected to not-shown electrodes, and sealed with a lid 32 to be provided as a surface acoustic wave device 30.

EXAMPLE 1

Hereafter, an example of the present invention is described.

A bonded substrate was obtained based on the aforementioned embodiment. A SAW resonator was provided on the principal surface of the piezoelectric substrate such that the propagation direction of an LLSAW was the X-direction.

In this example, as the piezoelectric substrate, lithium tantalate was used in which the thickness was 100 μm and the plane orientation was X-cut and 31° Y-propagating. Moreover, as the quartz substrate, a crystal that was grown by a hydrothermal synthesis method and cut out in the ST-cut direction to have 250 μm of thickness was used.

The bonded sample was polished on the lithium tantalate side to be thin with approximately 10 μm of thickness.

Figure 6:
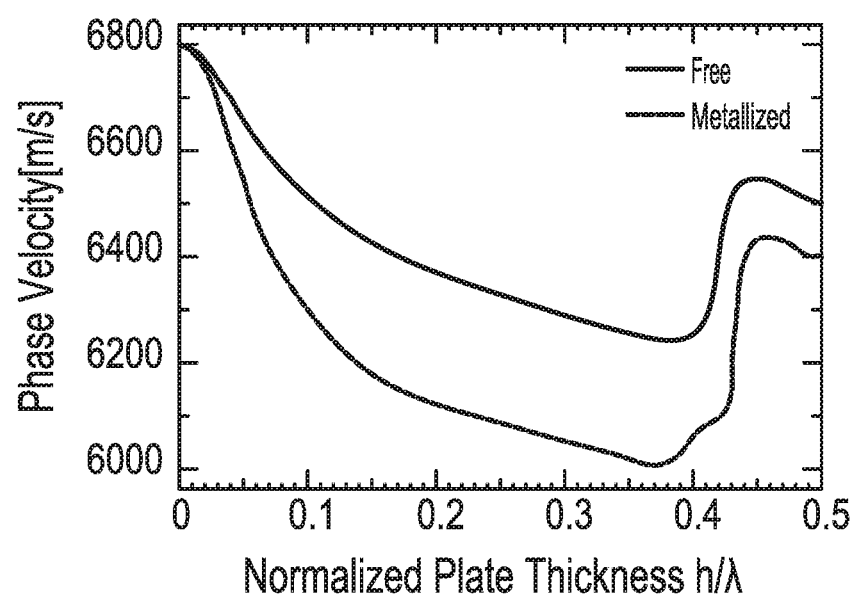
FIG. 6 is a diagram showing calculation results of a phase velocity of the bonded substrate in the same embodiment.
Figure 7:
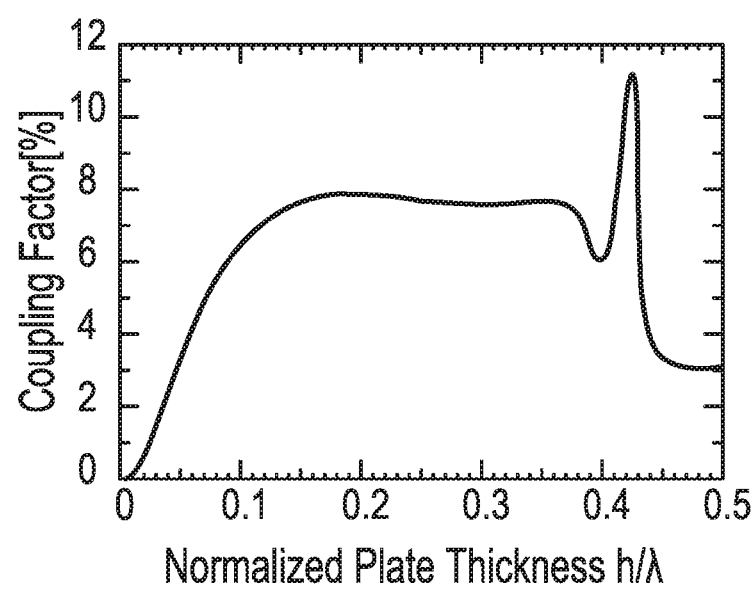
FIG. 7 is a diagram illustrating calculation results of an electromechanical coupling factor of the bonded substrate in the same embodiment.

For the sample material obtained by making the piezoelectric substrate thin after bonding the quartz substrate and the piezoelectric substrate, a phase velocity and an electromechanical coupling factor of an LLSAW were calculated, the results of which are presented in FIGS. 6 and 7.

The electromechanical coupling factor $K^2$ was obtained from phase velocities Vf and Vm in the case where the electric conditions on the piezoelectric substrate were set to be the free surface (Free) and the shorted surface (Metallized), based on $K^2=2(Vf-Vm)/Vf$ [%].

By using the longitudinal-type LSAW, the sample material gave the phase velocity approximately 1.5 times faster than a phase velocity (approximately 4100 m/s) of an LSAW on 36 to 45° Y-cut and X-propagating lithium tantalate which is currently widely used as a SAW filter substrate. Moreover, while $K^2$ of the longitudinal-type LSAW solely with X-cut and 31° Y-propagating lithium tantalate is 2.3%, approximately 3 times $K^2$ was obtained when the thickness of the piezoelectric substrate was 0.15 to 0.35 wavelengths. This value is larger than $K^2$ (approximately 5%) of an LSAW on 36 to 45° Y-cut and X-propagating lithium tantalate.

For the obtained bonded substrate, its bonding strength was measured by a method of tensile testing (application of tension perpendicular to the wafer plane). As a result, it was found that 4 MPa or more (converted into the value per unit area) of bonding strength was obtained, which was excellent bonding strength, further leading to the bulk destruction.

As above, the present invention has been described based on the aforementioned embodiment and example. The scope of the present invention is not limited to the contents of the aforementioned description, but proper modifications of the aforementioned embodiment and example can occur without departing from the scope of the present invention.

INDUSTRIAL APPLICABILITY

The present invention can be used for a SAW resonator, a SAW filter, a highly-functional piezoelectric sensor, a BAW device and the like.

What is claimed is:

1. A bonded substrate comprising: a quartz substrate; and a piezoelectric substrate which is bonded on or above the quartz substrate and on which a surface acoustic wave propagates, wherein the quartz substrate and the piezoelectric substrate are covalently bonded at an interface.

2. The bonded substrate according to claim 1, wherein the piezoelectric substrate is for exciting a longitudinal-type leaky surface acoustic wave.

3. The bonded substrate according to claim 1, further comprising an amorphous layer between the quartz substrate and the piezoelectric substrate, wherein the amorphous layer is covalently bonded to both of the quartz substrate and the piezoelectric substrate.

4. The bonded substrate according to claim 3, wherein the amorphous layer has 100 nm or less of thickness.

5. The bonded substrate according to claim 3, wherein the amorphous layer comprises silicon dioxide or aluminum oxide.

6. The bonded substrate according to claim 1, wherein a thickness of the piezoelectric substrate corresponds to 0.05 to 10 wavelengths with respect to a wavelength of the surface acoustic wave.

7. The bonded substrate according to claim 1, wherein the quartz substrate has 150 to 500 μm of thickness.

8. The bonded substrate according to claim 1, wherein the piezoelectric substrate is composed of lithium tantalate or lithium niobate.

9. The bonded substrate according to claim 8, wherein the piezoelectric substrate is 36° to 45° Y-cut lithium tantalate, X-cut lithium tantalate, 128° Y-cut lithium niobate, or X-cut lithium niobate.

10. A surface acoustic wave element comprising at least one interdigital electrode on a principal surface of the piezoelectric substrate in the bonded substrate according to claim 1.

11. A surface acoustic wave device, wherein the surface acoustic wave element according to claim 10 is sealed in a package.

* * * * *